(12) United States Patent
Zhao

(10) Patent No.: US 9,101,053 B2
(45) Date of Patent: Aug. 4, 2015

(54) ELECTRONIC DEVICE WITH SLIDABLE TRAY

(71) Applicants: Fu Tai Hua Industry (Shenzhen) Co., Ltd., Shenzhen (CN); HON HAI PRECISION INDUSTRY CO., LTD., New Taipei (TW)

(72) Inventor: Jiang Zhao, Shenzhen (CN)

(73) Assignees: Fu Tai Hua Industry (Shenzhen) Co., Ltd., Shenzhen (CN); HON HAI PRECISION INDUSTRY CO., LTD., New Taipei (TW)

( * ) Notice: Subject to any disclaimer, the term of this patent is extended or adjusted under 35 U.S.C. 154(b) by 169 days.

(21) Appl. No.: 13/913,527

(22) Filed: Jun. 10, 2013

(65) Prior Publication Data

US 2013/0342978 A1  Dec. 26, 2013

(30) Foreign Application Priority Data

Jun. 21, 2012  (CN) .......................... 2012 1 0206822

(51) Int. Cl.
| | |
|---|---|
| G06F 1/16 | (2006.01) |
| H05K 5/02 | (2006.01) |
| H05K 7/14 | (2006.01) |
| G06F 1/18 | (2006.01) |
| H05K 5/00 | (2006.01) |
| H05K 7/00 | (2006.01) |

(52) U.S. Cl.
CPC ............ *H05K 5/0221* (2013.01); *G06F 1/1679* (2013.01); *G06F 1/188* (2013.01); *H05K 7/14* (2013.01); *H05K 7/1401* (2013.01); *H05K 7/1405* (2013.01); *H05K 7/1411* (2013.01); *H05K 7/1461* (2013.01)

(58) Field of Classification Search
CPC ..... H05K 7/1411; H05K 7/14; H05K 7/1401; H05K 7/1405; H05K 7/1408; H05K 7/1409; G06F 1/188; G06F 1/187; G11B 33/127; G11B 33/128
USPC ............. 361/679.31, 679.32, 679.33, 679.34, 361/679.35, 679.36, 679.37, 679.38, 361/679.39, 728, 741, 747
See application file for complete search history.

(56) References Cited

U.S. PATENT DOCUMENTS 5,319,519 A * 6/1994 Sheppard et al. ........ 361/679.39

* cited by examiner

*Primary Examiner* — Hoa C Nguyen
*Assistant Examiner* — Binh Tran
(74) *Attorney, Agent, or Firm* — Novak Druce Connolly Bove + Quigg LLP

(57) ABSTRACT

An electronic device includes a housing, a tray, and a latching mechanism. The housing defines a receiving channel and an opening communicating with the receiving channel. The tray is slidably received in the receiving channel and slidable out of the housing through. The latching mechanism includes a hook, at least one latching member rotatably connected to the housing and comprising a latching clamp for latchingly engaging the hook, a driving assembly, and at least one first resilient element configured to apply a spring force to the at least one latching member. The driving assembly is configured to drive the at least one latching member to rotate from a locking position where the hook is lockingly engaged with the latching clamp to a releasing position where the latching clamp disengages from the hook.

20 Claims, 7 Drawing Sheets

ELECTRONIC DEVICE WITH SLIDABLE TRAY

BACKGROUND

1. Technical Field

This invention relates to an electronic device having a slidable tray.

2. Description of Related Art

Trays are often used in electronic devices, such as notebook computer, to support a memory card or an optical disk. The electronic devices further include a latching mechanism to latch the tray within the housing. Although conventional latching mechanisms satisfy basic requirement, a new type of latching mechanism is still needed.

BRIEF DESCRIPTION OF THE DRAWINGS

Many aspects of the embodiments can be better understood with reference to the following drawings. The components in the drawings are not necessarily drawn to scale, the emphasis instead being placed upon clearly illustrating the principles of the present disclosure. Moreover, in the drawings, like reference numerals designate corresponding parts throughout the several views.

DETAILED DESCRIPTION

Embodiments of the present disclosure are described with reference to the accompanying drawings.

Figure 1:
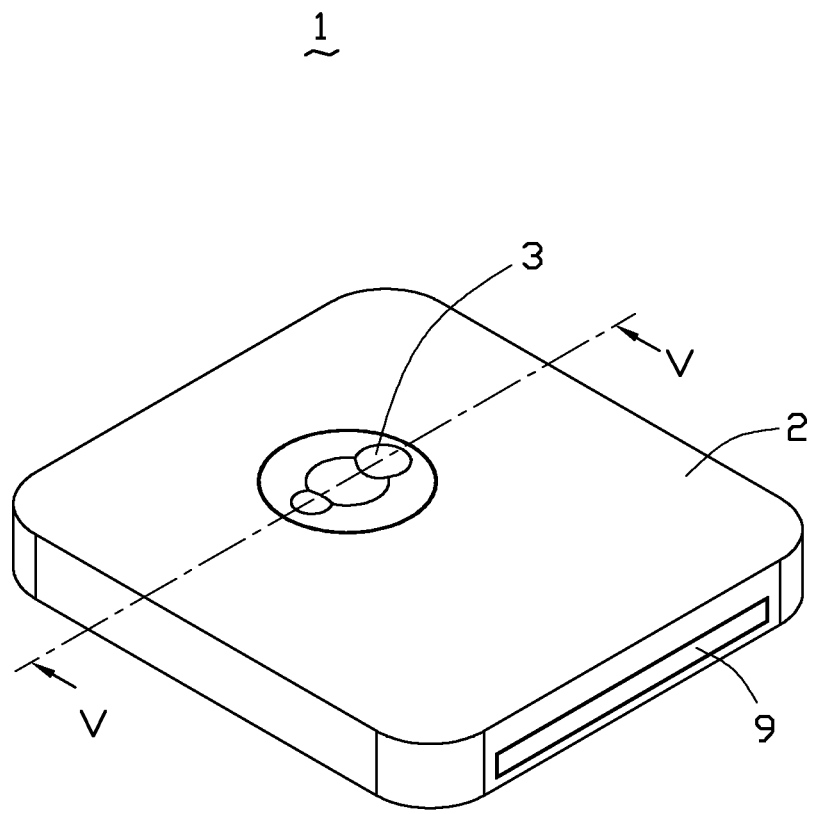
FIG. 1 is an isometric view of an electronic device with tray according to an exemplary embodiment.
Figure 2:
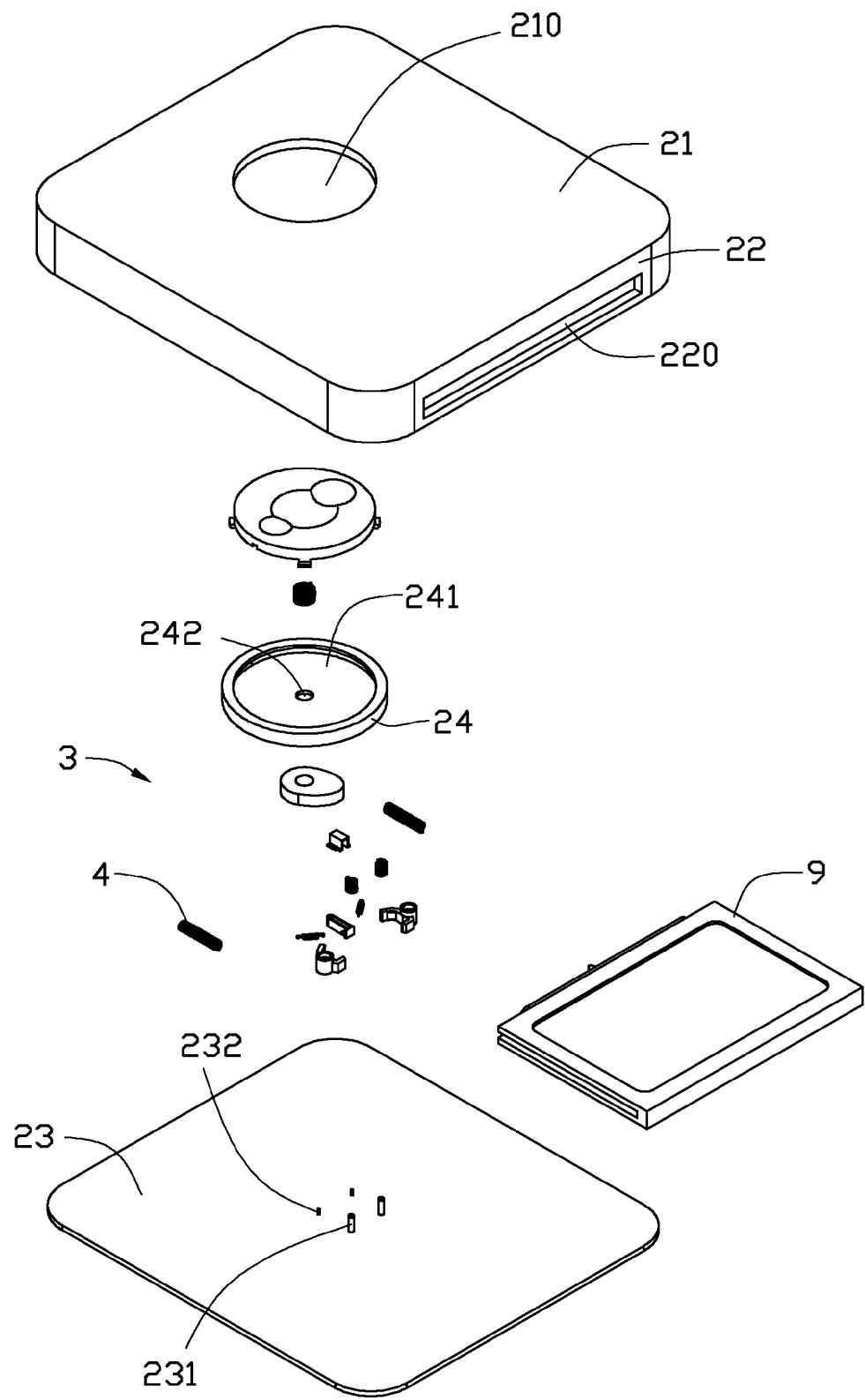
FIG. 2 is an exploded, isometric view of the electronic device of FIG. 1.
Figure 3:
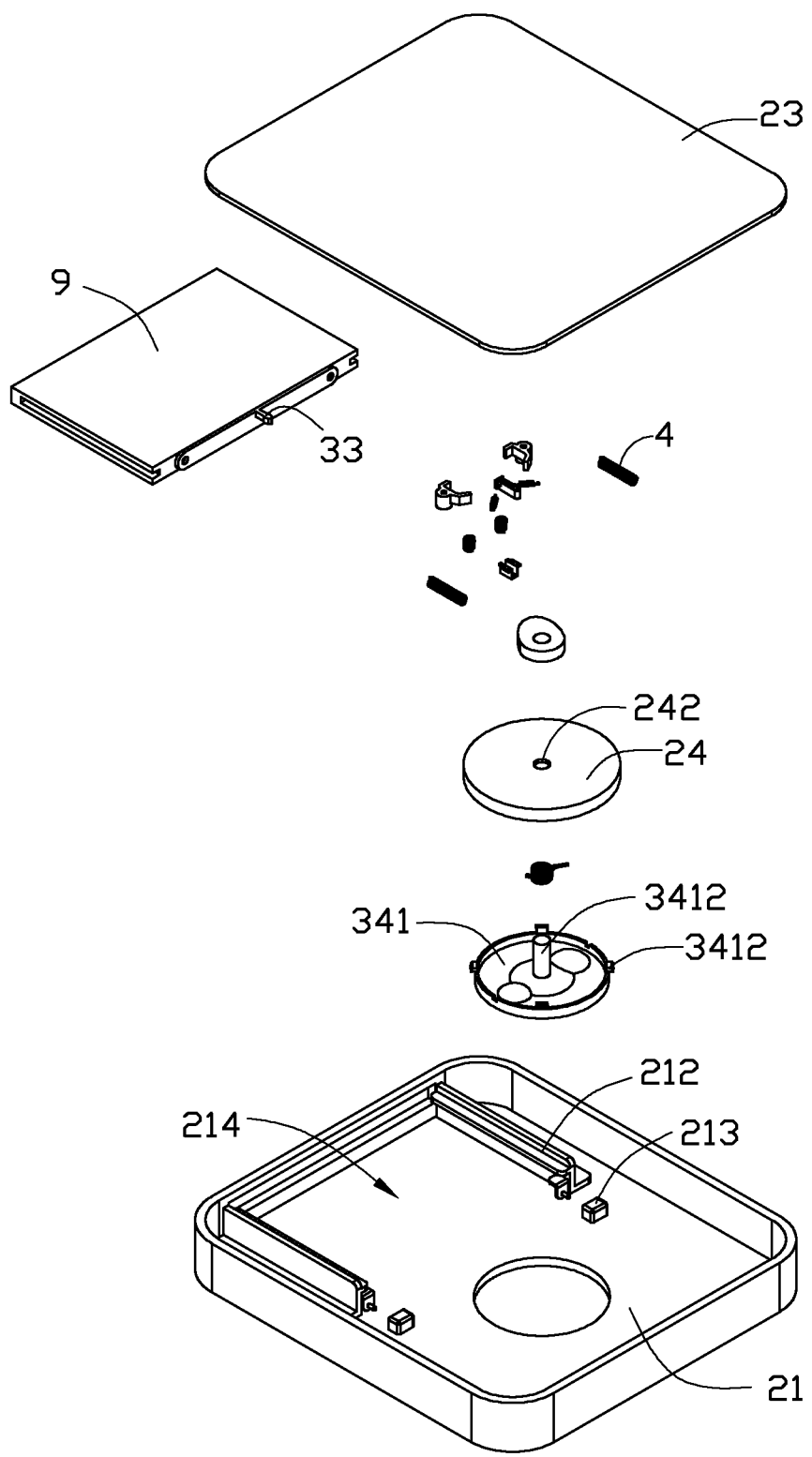
FIG. 3 is similar to FIG. 2, but viewed from a reverse perspective.

FIGS. 1-3 show an electronic device 1 according to an exemplary embodiment. The electronic device 1 includes a housing 2, a tray 9 slidably received in the housing 2, and a latching mechanism 3 for latching the tray 9.

The housing 2 includes a top plate 21, a bottom plate 23 opposite to the top plate 21, a side plate 22 perpendicularly connected to the top plate 21 and the bottom plate 23. The top plate 21 defines a through mounting hole 210 and includes two sliding rails 212 and two stopper blocks 213 protruding from an inner surface and toward the bottom plate 23. A receiving channel 214 is defined between the sliding rails 212. The tray 9 is slidably received in the receiving channel 214. Each stopper block 213 is substantially aligned with one of the sliding rails 212.

The side plate 22 defines a rectangular opening 220 communicating with the receiving channel 214, thereby allowing the tray 9 to slide into the receiving channel 214 through the opening 220.

The bottom plate 23 includes two shafts 231 and two positioning pins 232 protruding an inner surface and toward the top plate 21.

The housing 2 further includes a lid 24 coupled to an inner side of the top plate 21. The lid 24 defines a recess 241 facing the mounting hole 210 of the top plate 21 and a through hole 242 in a bottom of the recess 241.

Figure 4:
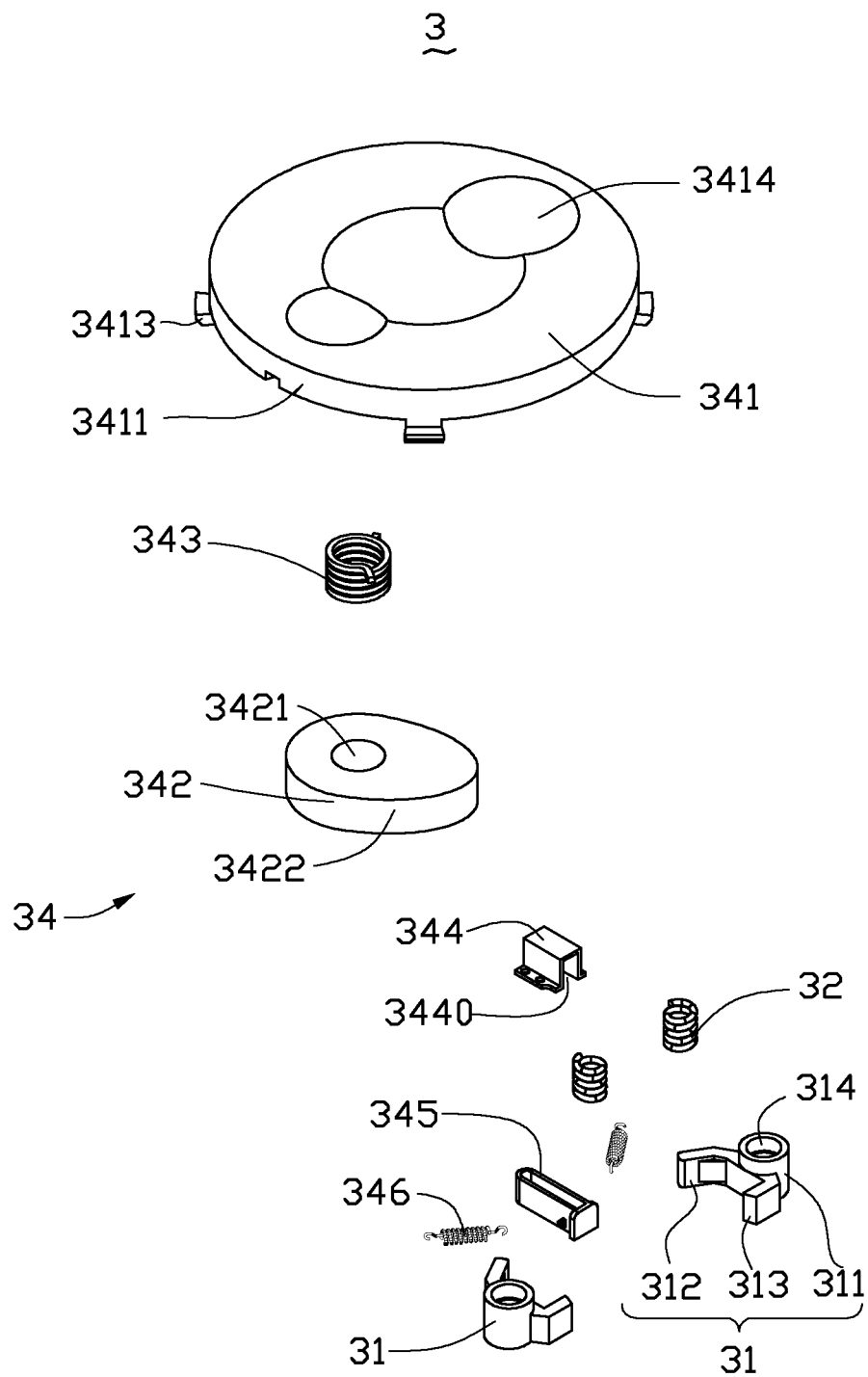
FIG. 4 is an enlarged view of a latching mechanism of the electronic device of FIG. 1.

FIG. 4 shows that the latching mechanism 3 includes two latching members 31, two first resilient elements 32, a hook 33, and a driving assembly 34.

Each latching member 31 includes a barrel 311, a latching clamp 312 for latching the hook 33, and a bar 313 for rotating the latching member 31. The latching clamp 312 and the bar 313 are connected to the barrel 311, cooperatively forming a C-shaped structure. The barrel 311 defines a pivot hole 314 for the extension of the shaft 231 of the bottom plate 23, thereby rotatably connecting the latching members 31 to the housing 2.

The first resilient elements 32 are used to provide an elastic resistance to the rotation of the latching member 31 with respect to the bottom plate 23. In the embodiment, the first resilient element 32 is a torsion spring coiled around the shaft 231 with opposite ends connected to the latching member 31 and the bottom plate 23.

The driving assembly 34 is used to drive the latching member 31 to rotate to a position where the latching clamps 312 of the latching members 31 disengage from the hook 33. In the embodiment, the driving assembly 34 includes a rotary button 341, a cam 342, a second resilient element 343, a guiding member 344, an elongated sliding member 345, and a third resilient element 346.

Figure 5:
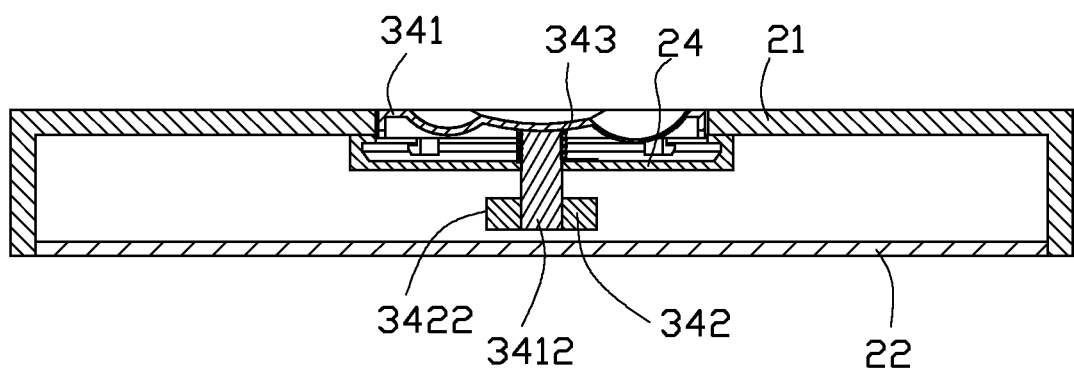
FIG. 5 is a cross-sectional view of the electronic device, taken along line V-V of FIG. 1.

FIG. 5 shows that the rotary button 341 includes a base plate 3411 retained in mounting hole 210 of the top plate 21, a post 3412 protruding downwardly from an inner surface of the driving assembly 34, and four tabs 3413 protruding radially outwardly from the lateral surface of base plate 3411 (see FIGS. 3-4). The post 3412 extends through the through hole 242 of the lid 24. The tabs 3413 abuts the inner side of the top plate 21, thereby preventing the rotary button 341 from sliding out of the mounting hole 210. The base plate 3411 defines an arc-shaped recessed portion 3414.

The cam 342 defines a hole 3421 and includes an undulated cam surface 3422. A distal end of the post 3412 is fixedly retained in the hole 3421 of the cam 342. Thus, the cam 342 can be rotate together with the rotary button 341.

The second resilient element 343 is used to provide a resistance to rotation of the rotary button 341 with respect to the top plate 21. In the embodiment, the second resilient element 343 is a torsion spring coiled around the post 3412 with opposite ends connected to the rotary button 341 and the lid 24.

The guiding member 344 defines a guiding slot 3440 facing the bottom plate 23. The guiding member 344 is coupled to the bottom plate 23 of the housing 2.

The sliding member 345 is movably received in the guiding slot 3440 with opposite ends always abutting against the undulated cam surface 3422 of the cam 342 and the bar 313 of the latching member 31.

The third resilient element 346 is used to provide a resistance to the movement of the sliding member 345 with respect to the bottom plate 23. In the embodiment, the third resilient element 346 is a spring coil with opposite ends fixed to the positioning pin 232 of the bottom plate 23 and the sliding member 345.

The electronic device 1 further includes two fourth resilient elements 4 positioned between the stopper block 213 of the housing 2 and the tray 9. When the tray 9 is pushed into the receiving channel 214, the latching clamp 312 of the latching mechanism 3 compressing the two fourth resilient elements 4 therebetween latches the tray 9. In the embodiment, the fourth resilient elements 4 are spring coils.

Figure 6:
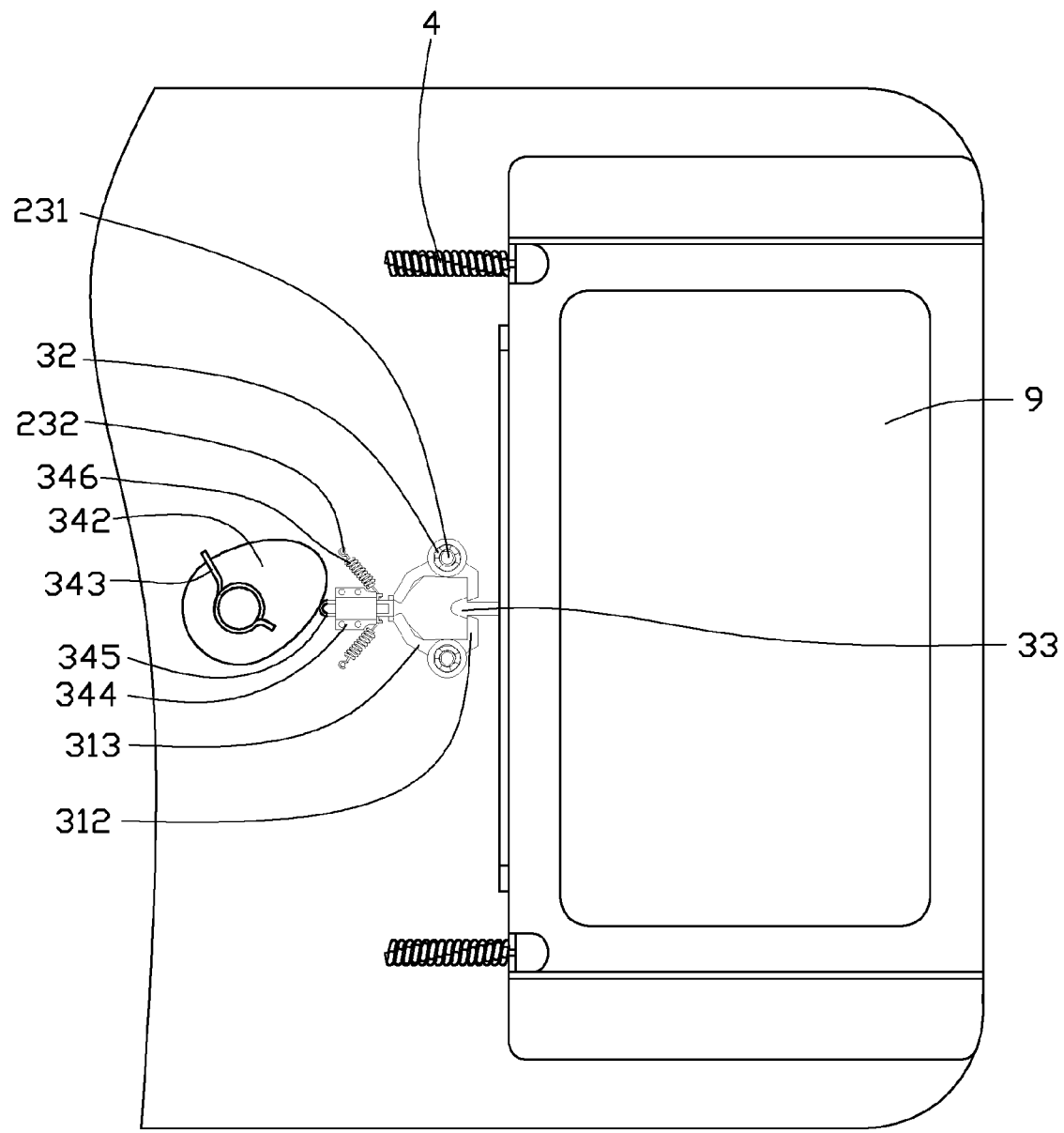
FIG. 6 is a schematic view of the electronic device, showing the tray being latched.

FIG. 6 shows that the tray 9 is received in the receiving channel 214 of the housing 2, the latching clamps 312 of the latching members 31 engage opposite sides of the hook 33, thereby latching the tray 9 within the receiving channel 214 of the housing 2. The two fourth resilient elements 4 are compressed between the stopper block 213 and the tray 9.

Figure 7:
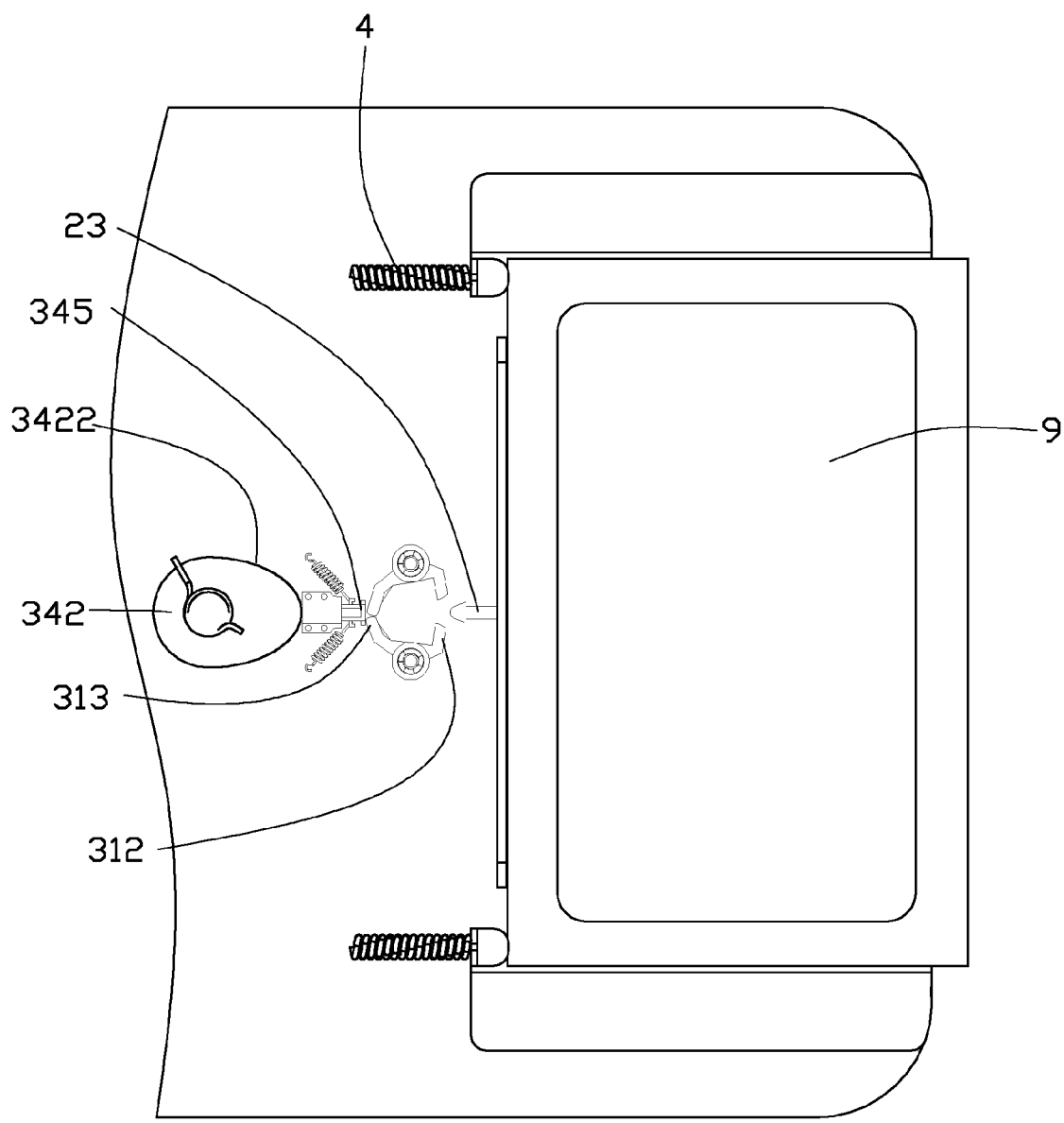
FIG. 7 is a schematic view of the electronic device, showing the tray being released.

FIG. 7 shows that when the rotary button 341 rotates the cam 342, the sliding member 344 is moved to push the bar 313 urged by the undulating cam surface 3422, and the latching clamps 312 are rotated correspondingly around the shaft 231 of the bottom plate 23. In addition, the latching clamps 312 disengage from the hook 33, the tray 9 is thus freed from the limitation of the latching clamp 312 of the latching mechanism 3. The fourth resilient elements 4 then restore and eject the tray 9. When releasing the rotary button 341, the first resilient element 32 then restores to rotate the latching member 31 back to its original position, the second resilient element 343 then restores to rotate the sliding member 345 back to its original position, and the third resilient element 346 then restores and slides the sliding member 345 to its original position, as shown in FIG. 6.

While various embodiments have been described and illustrated, the disclosure is not to be construed as being limited thereto. Various modifications can be made to the embodiments by those skilled in the art without departing from the true spirit and scope of the disclosure as defined by the appended claims.

What is claimed is:

1. An electronic device comprising:
   a housing defining a receiving channel and an opening communicating with the receiving channel;
   a tray slidably received in the receiving channel and capable of sliding out of the housing through the opening; and
   a latching mechanism comprising:
      a hook fixed to the tray;
      at least one latching member rotatably connected to the housing and comprising a latching clamp for latchingly engaging the hook, thereby latching the tray within the receiving channel of the housing;
      a driving assembly configured to drive the at least one latching member to rotate from a locking position where the hook is lockingly engaged with the latching clamp to a releasing position where the latching clamp disengages from the hook; and
      at least one first resilient element comprising opposite ends respectively fixed to the at least one latching member and the housing, the at least one first resilient member being configured to apply a spring force to the at least one latching member, thereby providing an elastic resistance to the rotation of the at least one latching member.

2. The electronic device as described in claim 1, wherein the at least one first resilient element comprises two first resilient elements and the least one latching member includes two latching members for engaging opposite sides of the hook.

3. The electronic device as described in claim 1, wherein the housing comprises a bottom plate, a top plate opposite to the bottom plate, a first sidewall of the top plate defining the opening, a second sidewall, a third sidewall, a fourth sidewall, and two sliding rails protruding from an inner side of the top plate, and the receiving channel is defined between the sliding rails.

4. The electronic device as described in claim 1, wherein the housing comprises at least one shaft, and the at least one latching member comprises a barrel defining a pivot hole for the extension of the at least one shaft, thereby rotatably connecting the at least one latching member to the housing.

5. The electronic device as described in claim 4, wherein the at least one first resilient member is a torsion spring coiled around the at least one shaft.

6. The electronic device as described in claim 4, wherein the at least one latching member comprises a bar connected to the barrel, the driving assembly comprises a rotary button mounted in the housing, a cam with a cam surface and fixed to the rotary button, a second resilient element with opposite ends connected to the rotary button and the housing for providing a resistance to rotation of the rotary button with respect to the housing, a sliding member movably connected to the housing with opposite ends respectively contacting the bar of the at least one latching member and the cam surface of the cam, and at least one third resilient element with opposite ends connected to the at least one sliding member and the housing for providing a resistance to the movement of the sliding member with respect to the housing.

7. The electronic device as described in claim 6, wherein the housing defines a through mounting hole, the rotary button comprises a base plate retained in the through mounting hole and a post protruding from the base plate, and the cam defines a hole for fixedly retaining a distal end of the post.

8. The electronic device as described in claim 7, wherein the housing further comprises a lid coupled to the housing and defining a through hole for the extension of the post, thereby preventing the rotary button from sliding into the housing.

9. The electronic device as described in claim 8, wherein the second resilient element is a torsion spring coiled around the post with opposite ends fixed to the rotary button and the lid.

10. The electronic device as described in claim 6, wherein the driving assembly comprises a guiding member coupled to the housing and defining a guiding slot for the extension of the sliding member.

11. The electronic device as described in claim 1, further comprising at least one fourth resilient element positioned between the housing and the tray, wherein when the tray is pushed into the receiving channel and latched by the latching clamp of the latching mechanism, the at least one fourth resilient element is compressed therebetween.

12. An electronic device comprising:
   a housing defining a receiving channel and an opening communicating with the receiving channel;
   a tray slidably received in the receiving channel and capable of sliding out of the housing through the opening; and
   a latching mechanism comprising:
      a hook fixed to the tray;
      at least one latching member rotatably connected to the housing and comprising a latching clamp for latchingly engaging the hook, thereby latching the tray within the receiving channel of the housing;
      a driving assembly configured to drive the at least one latching member to rotate from a locking position where the hook is lockingly engaged with the latching clamp to a releasing position where the latching clamp disengages from the hook; and
      at least one first resilient element comprising opposite ends respectively fixed to the at least one latching member and the housing, the at least one first resilient member being configured to apply a spring force to the at least one latching member, thereby providing an elastic resistance to the rotation of the at least one latching member;

wherein the at least one latching member comprises a bar, the driving assembly comprises a rotary button mounted in the housing, a cam with a cam surface and fixed to the rotary button, a second resilient element with opposite ends connected to the rotary button and the housing for providing a resistance to rotation of the rotary button with respect to the housing, a sliding member movably connected to the housing with opposite ends respectively contacting the bar of the at least one latching member and the cam surface of the cam, and at least one third resilient element with opposite ends connected to the at least one sliding member and the housing for providing a resistance to the movement of the sliding member with respect to the housing.

13. The electronic device as described in claim 12, wherein the housing comprises at least one shaft, and the at least one latching member comprises a barrel defining a pivot hole for the extension of the at least one shaft, thereby rotatably connecting the at least one latching member to the housing.

14. The electronic device as described in claim 13, wherein the at least one first resilient member is a torsion spring coiled around the at least one shaft.

15. The electronic device as described in claim 12, wherein the housing defines a through mounting hole, the rotary button comprises a base plate retained in the through mounting hole and a post protruding from the base plate, and the cam defines a hole for fixedly retaining a distal end of the post.

16. The electronic device as described in claim 15, wherein the housing further comprises a lid coupled to the housing and defining a through hole for the extension of the post, thereby preventing the rotary button from sliding into the housing.

17. The electronic device as described in claim 12, further comprising at least one fourth resilient element positioned between the housing and the tray, wherein when the tray is pushed into the receiving channel and latched by the latching clamp of the latching mechanism, the at least one fourth resilient element is compressed therebetween.

18. An electronic device comprising:
a housing defining a receiving channel and an opening communicating with the receiving channel;
a tray slidably received in the receiving channel and capable of sliding out of the housing through the opening; and
a latching mechanism comprising:
a hook fixed to the tray;
at least one latching member rotatably connected to the housing and comprising a latching clamp for latchingly engaging the hook, thereby latching the tray within the receiving channel of the housing;
a driving assembly configured to drive the at least one latching member to rotate from a locking position where the hook is lockingly engaged with the latching clamp to a releasing position where the latching clamp disengages from the hook;
at least one first resilient element comprising opposite ends respectively fixed to the at least one latching member and the housing, the at least one first resilient member being configured to apply a spring force to the at least one latching member, thereby providing an elastic resistance to the rotation of the at least one latching member; and
at least one second resilient element positioned between the housing and the tray, wherein when the tray is pushed into the receiving channel and latched by the latching clamp of the latching mechanism, the at least one second resilient element is compressed therebetween.

19. The electronic device as described in claim 18, wherein the housing comprises at least one shaft, and the at least one latching member comprises a barrel defining a pivot hole for the extension of the at least one shaft, thereby rotatably connecting the at least one latching member to the housing.

20. The electronic device as described in claim 19, wherein the at least one first resilient member is a torsion spring coiled around the at least one shaft.

* * * * *